United States Patent
Aremallapur et al.

(10) Patent No.: US 10,879,845 B2
(45) Date of Patent: Dec. 29, 2020

(54) PHASE COHERENT NUMERICALLY CONTROLLED OSCILLATOR

(71) Applicant: TEXAS INSTRUMENTS INCORPORATED, Dallas, TX (US)

(72) Inventors: Nagalinga Swamy Basayya Aremallapur, Ranebennur (IN); Sriram Murali, Bengaluru (IN); Jawaharlal Tangudu, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/403,777

(22) Filed: May 6, 2019

(65) Prior Publication Data

US 2020/0212844 A1 Jul. 2, 2020

Related U.S. Application Data

(60) Provisional application No. 62/787,020, filed on Dec. 31, 2018.

(51) Int. Cl.
| | | |
|---|---|---|
| *H03B 21/02* | (2006.01) | |
| *G06F 1/02* | (2006.01) | |
| *H03L 7/099* | (2006.01) | |
| *H03L 7/16* | (2006.01) | |
| *G06F 1/03* | (2006.01) | |

(52) U.S. Cl.
CPC ............. *H03B 21/02* (2013.01); *G06F 1/022* (2013.01); *G06F 1/0342* (2013.01); *H03L 7/0994* (2013.01); *H03L 7/16* (2013.01)

(58) Field of Classification Search
CPC ... G06F 1/00; G06F 1/02; G06F 1/022; G06F 1/03; G06F 1/0321; G06F 1/0342; H03L 7/00; H03L 7/02; H03L 7/08; H03L 7/089; H03L 7/0991; H03L 7/0994; H03L 7/16; H03L 7/18; H03L 7/1803; H03L 7/1806; H03L 7/181
See application file for complete search history.

(56) References Cited

U.S. PATENT DOCUMENTS

| | | |
|---|---|---|
| 5,815,220 A | 9/1998 | Marshall |
| 6,121,816 A | 9/2000 | Tonks et al. |
| 7,109,808 B1 * | 9/2006 | Pelt ........................ G06F 1/0328 327/105 |
| 2007/0067123 A1 | 3/2007 | Jungerman |

(Continued)

*Primary Examiner* — Diana J. Cheng
(74) *Attorney, Agent, or Firm* — John R. Pessetto; Charles A. Brill; Frank D. Cimino

(57) ABSTRACT

A phase coherent NCO circuit includes a base frequency NCO, a phase seeding circuit, a scaled frequency NCO, a sine/cosine generator. The base frequency NCO is configured to generate base phase values based on a base frequency control word. The phase seeding circuit is coupled to the base frequency NCO. The phase seeding circuit is configured to generate a seed phase value based on the base phase values and a scale factor value. The scaled frequency NCO is coupled to the phase seeding circuit. The scaled frequency NCO is configured to generate oscillator phase values based on the phase seed value and an oscillator frequency control word. The sine/cosine generator is coupled to the scaled frequency NCO. The sine/cosine generator is configured to generate oscillator output samples based on the oscillator phase values.

13 Claims, 6 Drawing Sheets

(56) References Cited

U.S. PATENT DOCUMENTS

| | | | |
|---|---|---|---|
| 2011/0260916 A1* | 10/2011 | Zhodzishsky | G01S 19/24 342/357.68 |
| 2014/0364132 A1* | 12/2014 | Rey | H04L 27/12 455/450 |
| 2016/0277030 A1 | 9/2016 | Burbano et al. | |
| 2017/0078083 A1* | 3/2017 | Floch | H03L 7/22 |

* cited by examiner

PHASE COHERENT NUMERICALLY CONTROLLED OSCILLATOR

RELATED APPLICATIONS

This application claims priority to U.S. Provisional Application No. 62/787,020, filed Dec. 31, 2018, titled "Phase Coherent Numerically Controlled Oscillator," which is incorporated herein by reference.

BACKGROUND

In wireless transceivers, down converters transform a radio frequency (RF) signal into a baseband signal centered at the zero frequency or some other intermediate frequency. Similarly, up converters transform a baseband signal into an RF signal. Down conversion and up conversion have traditionally been performed in the analog domain. However, the wireless transceivers of the next generation perform down conversion and/or up conversion in the digital domain. For example, a receiver may employ RF sampling, in which the RF signal is directly sampled with a high speed, high performance analog-to-digital converter (ADC) (e.g., a 14 bit, 3 giga-sample-per-second ADC). The use of RF sampling allows such receivers to employ digital down-converters that avoid mixers in the RF/analog domain. In a digital down-converter, mixing is implemented using digital multiplication circuitry that multiples a digitized signal RF signal and a digital oscillator signal.

SUMMARY

A numerically controlled oscillator (NCO) circuit that allows changing of oscillator frequencies and maintains coherent phase of the oscillator frequencies across changes is disclosed herein. In one example, a phase coherent NCO circuit includes a base frequency NCO, a phase seeding circuit, and a scaled frequency NCO. The base frequency NCO includes a base frequency control input and a base phase output. The phase seeding circuit is coupled to the base frequency NCO. The phase seeding circuit includes a base phase input and a seed phase output. The base phase input is coupled to the base phase output of the base frequency NCO. The scaled frequency NCO is coupled to the phase seeding circuit. The scaled frequency NCO includes a seed phase input and an oscillator phase output. The seed phase input is coupled to the seed phase output of the phase seeding circuit.

In another example, a radio frequency (RF) sampling transceiver includes a digital mixer circuit and a phase coherent NCO circuit. The phase coherent NCO circuit is coupled to the digital mixer circuit. The phase coherent NCO includes a base frequency NCO, a phase seeding circuit, and a scaled frequency NCO. The base frequency NCO includes a base frequency control input and a base phase output. The phase seeding circuit is coupled to the base frequency NCO. The phase seeding circuit includes a base phase input and a seed phase output. The base phase input is coupled to the base phase output of the base frequency NCO. The scaled frequency NCO is coupled to the phase seeding circuit. The scaled frequency NCO includes a seed phase input and an oscillator phase output. The seed phase input is coupled to the seed phase output of the phase seeding circuit.

In a further example, a phase coherent NCO circuit includes a base frequency NCO, a phase seeding circuit, a scaled frequency NCO, and a sine/cosine generator. The base frequency NCO is configured to generate base phase values based on a base frequency control word. The phase seeding circuit is coupled to the base frequency NCO. The phase seeding circuit is configured to generate a seed phase value based on the base phase values and a scale factor value. The scaled frequency NCO is coupled to the phase seeding circuit. The scaled frequency NCO is configured to generate oscillator phase values based on the phase seed value and an oscillator frequency control word. The sine/cosine generator is coupled to the scaled frequency NCO. The sine/cosine generator is configured to generate oscillator output samples based on the oscillator phase values

BRIEF DESCRIPTION OF THE DRAWINGS

For a detailed description of various examples, reference will now be made to the accompanying drawings in which.

DETAILED DESCRIPTION

Figure 1:
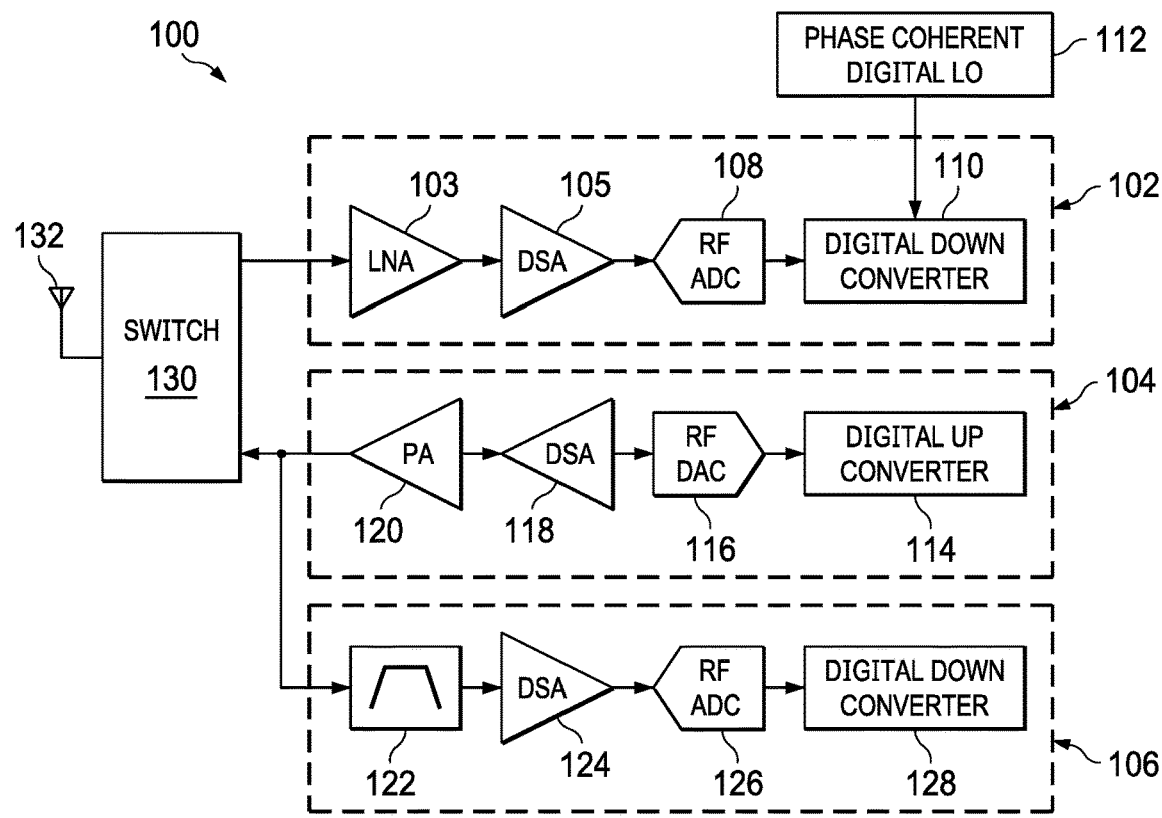
FIG. 1 shows a block diagram for an example wireless transceiver that includes a phase coherent numerically controlled oscillator (NCO) in accordance with the present disclosure.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Radio frequency (RF) sampling transceivers employ digital mixers for signal down conversion. Digital mixers employ a digital local oscillator that generates the digital oscillator samples for mixing with a digitized RF signal. The digital local oscillator (LO) includes a numerically controlled oscillator (NCO) that generates the phase sequence θ(n) of the digital LO, given a frequency and a starting phase. An NCO is numerically controlled in that the oscillator output frequency (e.g., the increment of θ(n)) is controlled by a numeric frequency control word (a number specifying a phase increment value) provided to the NCO. In some applications, the frequency of the digital LO is changed from a first frequency to a second frequency and back to the first frequency. In such applications, it is desirable to maintain phase coherency. That is, when resuming generation of the first frequency, the phase of the first frequency should be the phase of the first frequency accumulated over time since the generation of the first frequency was discontinued to generate the second frequency.

Some digital LO implementations provide phase coherency by maintaining a phase accumulator for each frequency generated by the digital LO. In such implementations, the circuit area and power consumption increase in proportion to the number of frequencies supported. Moreover, the frequencies applied must be selected prior to activation of the digital LO and cannot be changed while the digital LO is running. Other implementations apply a high-resolution, high-speed phase multiplier to generate the oscillator phase based on a selectable frequency control word and a count value. Such a phase multiplier requires substantial circuit area and power.

The phase coherent NCOs disclosed herein support phase coherent switching between multiple output frequencies while consuming less circuit area and power than other implementations. The phase coherent NCOs of the present disclosure include a base frequency NCO that generates base phase values corresponding to a base frequency. When a change in output frequency is requested, phase seeding circuitry computes a seed phase value based on the base phase value and a scale factor value corresponding the requested frequency. To reduce power consumption, the phase seeding circuitry is active only while computing the seed phase value. A scaled frequency NCO applies the seed phase value to generate the phase values for the oscillator output. Thus, implementations include only two NCOs, and phase seeding circuitry that runs only when changing the oscillator output frequency. Moreover, the phase seeding circuitry includes a phase multiplier that generates modulo-wrapped phase, thereby reducing the number of bits and overall circuit area of the multiplier.

FIG. 1 shows a block diagram for an example wireless transceiver 100 that includes a phase coherent numerically controlled oscillator (NCO) in accordance with the present disclosure. The wireless transceiver 100 includes an RF sampling receiver 102, a transmitter 104, a feedback channel 106, a phase coherent digital LO 112, switching circuitry 130, and an antenna 132. Various implementations of the wireless transceiver 100 include one or more of the RF sampling receiver 102, the transmitter 104, and/or the feedback channel 106. For example, an implementation of the wireless transceiver 100 includes only the RF sampling receiver 102.

The RF sampling receiver 102 includes a low noise amplifier (LNA) 103, a digital step attenuator (DSA) 105, an RF ADC 108, a digital down converter (DDC) 110 (also referred to as "digital mixer 110"). The RF ADC 108 digitizes RF signals that are detected by the antenna 132 and routed through the switching circuitry 130 to the DSA 105. The detected RF signals are amplified by the LNA 103, and attenuated by the DSA 105. The DDC 110 down converts the digitized RF signals to base-band or to one or more selected intermediate frequency by multiplying digital samples received from the 108 with samples of digital local oscillator signal generated by the phase coherent digital LO 112. The phase coherent digital LO 112 is coupled to the DDC 110, and provides digital oscillator signal samples to the DDC 110 for use in down conversion of received RF signals. The digital oscillator signal samples provided by the phase coherent digital LO 112 maintain phase coherence across intervals during which different frequencies are generated by the phase coherent digital LO 112. In some implementations of the RF sampling receiver 102, the phase coherent digital LO 112 is included in the DDC 110.

Figure 2:
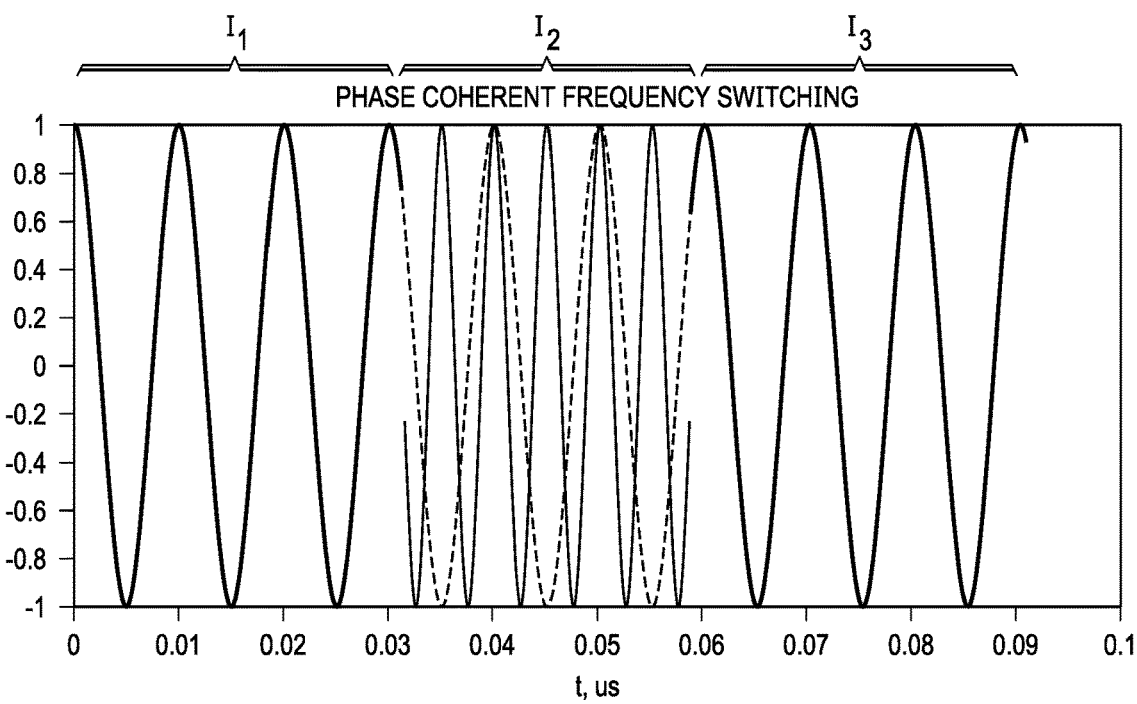
FIG. 2 shows an example of phase coherent switching of oscillator frequency in accordance with the present disclosure.

FIG. 2 shows an example of phase coherent switching of oscillator frequency in accordance with the present disclosure. In FIG. 2, the phase coherent digital LO 112 generates a first frequency in the interval $I_1$, generates a second frequency in the interval $I_2$, and again generates the first frequency in interval $I_3$. At initiation of the interval $I_3$, generation of the first frequency begins at a phase value consistent with maintaining generation of the first frequency during the interval $I_2$.

The transmitter 104 includes a power amplifier (PA) 120, a DSA 118, an RF digital-to-analog converter (DAC) 116, and a digital up converter (DUC) 114 (also referred to as "digital mixer 114"). The DUC 114 is coupled to the phase coherent digital LO 112 (or an instance of the phase coherent digital LO 112), and the phase coherent digital LO 112 provides digital oscillator signal samples to the DUC 114 for use in up conversion of digital signals to be transmitted. The DUC 114 mixes digital values to be transmitted with digital oscillator signal samples provided by the digital local oscillator phase coherent digital LO 112. The output of the DUC 114 is converted to analog signals by the DAC 116. The analog signals are attenuated by the DSA 118 and amplified by the PA 120. The output of the PA 120 is provided, via the switching circuitry 130, to the antenna 132 for transmission. In some implementations of the transmitter 104, the phase coherent digital LO 112 is included in the DUC 114.

The feedback channel 106 is coupled to the output of the transmitter 104. The feedback channel 106 includes an RF ADC 126, a DSA 124, and a DDC 128 (also referred to as "digital mixer 128"). The RF ADC 126 receives, via the DSA 124, the RF signal output by the PA 120, and digitizes the received RF signal. The DDC 128 mixes the signal samples produced by the RF ADC 126 with digital oscillator samples (i.e., digital local oscillator signal) generated by the phase coherent digital LO 112 (or an instance of the phase coherent digital LO 112) to down convert the output of the transmitter 104. The down converted RF transmitter output signal provided by the feedback channel feedback channel 106 is used, for example, to determine how the signal provided to the PA 120 should be predistorted. In some implementations of the feedback channel 106, the phase coherent digital LO 112 is included in the DDC 128.

Figure 3:
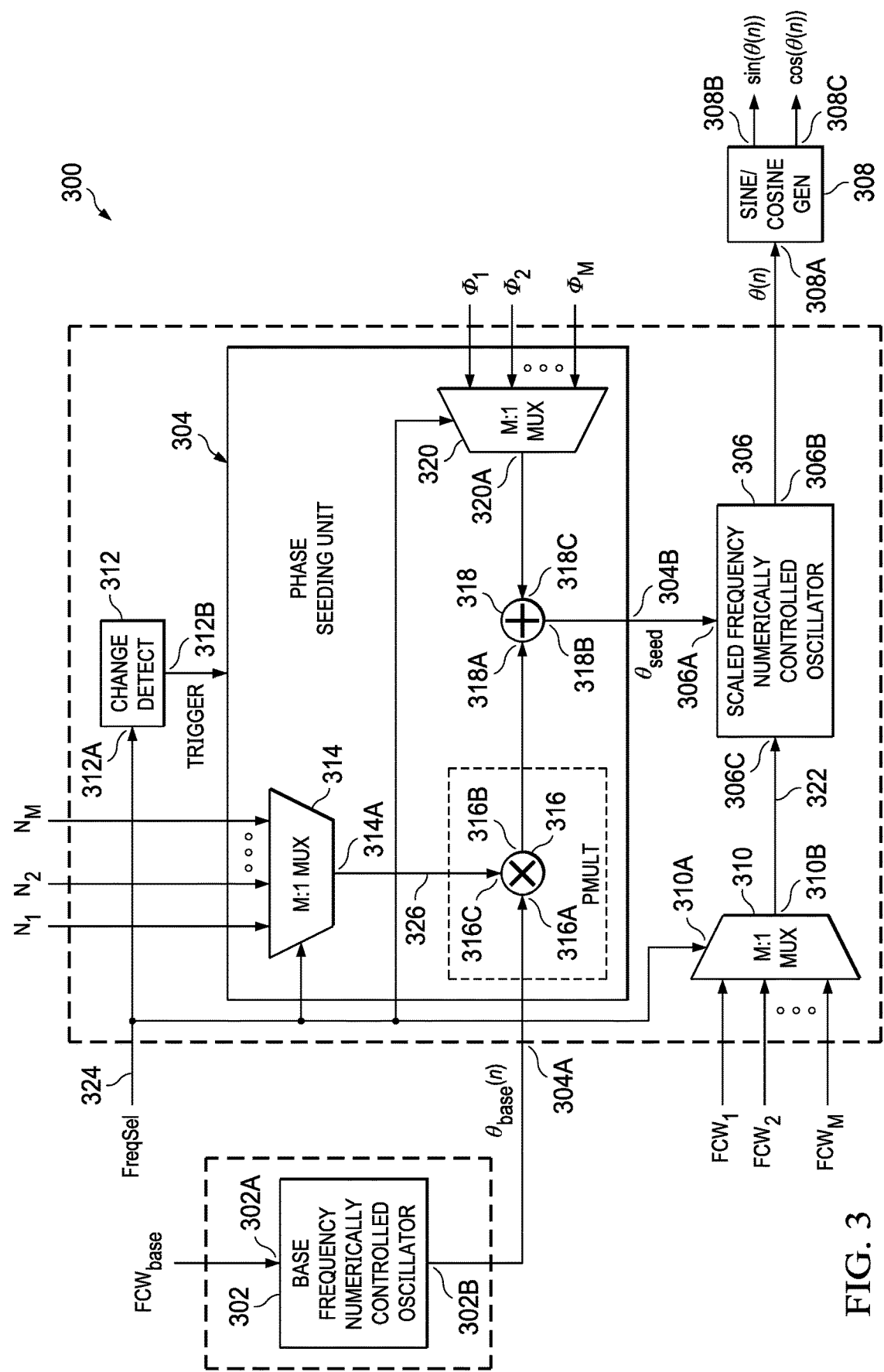
FIG. 3 shows a block diagram for an example phase coherent NCO in accordance with the present disclosure.

FIG. 3 shows a block diagram for an example phase coherent NCO circuit 300 in accordance with the present disclosure. The phase coherent NCO circuit 300 is an implementation of the 112. The phase coherent NCO circuit 300 includes a base frequency NCO 302, a phase seeding circuit 304 coupled to the base frequency NCO 302, a scaled frequency NCO 306, a sine/cosine generator 308, a frequency control selector 310, and a change detection circuit 312. The base frequency NCO 302 generates base phase values ($\theta_{base}(n)$) for a base frequency. All output frequencies of the phase coherent NCO circuit 300 are an integer multiple of the base frequency. The base frequency NCO 302 includes a phase accumulator that adds the frequency control word ($FCW_{base}$) for the base frequency to an accumulated phase value to generate the base phase values. The base frequency NCO 302 includes a base frequency control input 302A for reception of the base frequency control word, and a base frequency output 302B for providing the base phase values to the phase seeding circuit 304. The phase seeding circuit 304 includes a base phase input 304A that is coupled to the base phase output 302B of the base frequency NCO 302.

The scaled frequency NCO 306 is coupled to the phase seeding circuit 304, and generates the phase values (θ(n)) that correspond to an output frequency of the phase coherent NCO circuit 300. The scaled frequency NCO 306 includes a phase accumulator that adds a frequency control word 322 for the output frequency to an accumulated phase value to generate θ(n). The scaled frequency NCO 306 is coupled to the sine/cosine generator 308, and includes an oscillator phase output 306B for providing the θ(n) to the sine/cosine generator 308. The sine/cosine generator 308 stores sine and/or cosine samples values in memory, and selects the sine and/or cosine sample values to output based on the phase values θ(n). The sine/cosine generator 308 includes a phase input 308A for receiving the phase values θ(n). The phase input 308A is coupled to the oscillator phase output 306B of the scaled frequency NCO 306. The sine/cosine generator 308 includes a sine sample output 308B and/or a cosine sample output 308C.

The frequency control selector 310 selects one of multiple available frequency control words to provide to the scaled frequency NCO 306 as the frequency control word 322. The multiple frequency control words from which the frequency control selector 310 selects represent the multiple frequencies that the phase coherent NCO circuit 300 can generate at a given time. The frequency control selector 310 selects the frequency control word 322 based on a frequency selection value 324 provided to the phase coherent NCO circuit 300. Changing the frequency selection value 324 changes the output frequency of the phase coherent NCO circuit 300. The frequency control selector 310 includes a frequency selection input 310A for receiving the frequency selection value 324 and frequency control output 310B for providing the frequency control word 322 to the scaled frequency NCO 306. The scaled frequency NCO 306 includes a frequency control input 306C for receiving the frequency control word 322. The frequency control input 306C is coupled to the frequency control output 310B.

When the output frequency of the phase coherent NCO circuit 300 changes responsive to a change in the frequency selection value 324, the phase of the output signal generated by the phase coherent NCO circuit 300 is coherent with the phase of the output signal generated at that frequency starting at some time in the past. For example, the phase value θ(n) generated when changing from a first frequency to a second frequency is representative of the phase of the second frequency had the second frequency been continually generated in the past. At a change of the frequency selection value 324, generation of θ(n) (i.e., the phase of the sine/cosine samples output by the phase coherent NCO circuit 300) is controlled by the phase seeding circuit 304. At each change of the frequency selection value 324, the phase seeding circuit 304 generates a seed phase value (θ$_{seed}$) that is provided to the scaled frequency NCO 306. The seed phase value specifies the starting phase of the output signal at the selected frequency. The phase seeding circuit 304 includes a seed phase output 304B for providing the seed phase value to the scaled frequency NCO 306. The scaled frequency NCO 306 includes a seed phase input 306A that is coupled to the seed phase output 304B.

The phase seeding circuit 304 includes a phase multiplier 316, a frequency scaler selection circuit 314, a phase summation circuit 318, and a phase multiplexer 320. The frequency scaler selection circuit 314 is coupled to the phase multiplier 316, and selects one of multiple available frequency scale values to provide to the phase multiplier 316 as the frequency scale value 326 (also referred to as scale factor value 326). The multiple frequency scale values from which the frequency scaler selection circuit 314 selects represent the multiple values by which the base frequency (i.e., the frequency generated by the base frequency NCO 302) is multiplied to produce the output frequencies generated by the scaled frequency NCO circuit 306. The frequency scaler selection circuit 314 selects the frequency scale value 326 based on the frequency selection value 324 provided to the phase coherent NCO circuit 300. The frequency scaler selection circuit 314 includes a scale value output 314A for providing the frequency scale value 326 to the phase multiplier 316. The phase multiplier 316 includes a scale value input 316C that is coupled to the scale value output 314A. The frequency scale value 326 is expressed as:

$$N_k = \frac{f_k}{f_{base}}$$

where:
$f_k$ is the frequency specified by the frequency selection value 324; and
$f_{base}$ is the frequency generated by the base frequency NCO 302.

The phase multiplier 316 multiplies the frequency scale value 326 and the base phase values to generate a phase product specifying an initial phase value for the frequency corresponding to the frequency selection value 324.

$$\theta_{seed} = N_k \theta_{base}(n)$$

where:
$N_k$ is the frequency scale value 326; and
$\theta_{base}$(n) is the base phase generated by the base frequency NCO 302.

The phase multiplier 316 includes a base phase input 316A that is coupled to the base phase output 302B of the base frequency NCO 302. The phase multiplier 316 generates a modulo-wrapped phase value, which allows the phase multiplier 316 to compute only the number of bits needed for the phase seed value. Unused higher order bits (i.e., unused MSBs) need not be computed, thereby reducing the circuit area of the phase multiplier 316. Moreover, without affecting phase coherence, in some implementations, the phase multiplier 316 computes a phase product over multiple clock cycles, which allows for further simplification of the circuitry and reduction of circuit area of the phase multiplier 316.

The phase summation circuit 318 is coupled to the phase multiplier 316 and the phase multiplexer circuit 320. The phase product generated by the phase multiplier 316 is provided to the phase summation circuit 318. The phase multiplier 316 includes a scaled phase output 316B that is coupled to a scaled phase input 318A of the phase summation circuit 318 for transferring the phase product to the phase summation circuit 318. The phase summation circuit 318 adds a phase offset value to the phase product received from the phase multiplier 316. The phase offset value is provided to the phase summation circuit 318 by the phase multiplexer 320. The phase multiplexer 320 selects one of a plurality of phase offset values to provide to the phase summation circuit 318 based on the frequency selection value 324. The phase multiplexer 320 includes a phase offset output 320A that is coupled to a phase offset input 318C of the phase summation circuit 318. The phase summation circuit 318 includes a seed phase output 318B that is coupled the seed phase input 306A of the scaled frequency NCO 306.

Generation of a seed phase value by the phase seeding circuit 304 is triggered by the change detection circuit 312. The change detection circuit 312 is coupled to the phase seeding circuit 304 and the frequency control selector 310. The change detection circuit 312 monitors the frequency selection value 324, and detects changes in the frequency selection value 324. When a change in the frequency selection value 324 is detected, the change detection circuit 312 triggers the phase seeding circuit 304 to generate a seed phase value. Thus, the circuitry of the phase seeding circuit 304 is in a low power state until triggered by the change detection circuit 312, and after generation of a seed phase value returns to the low power state until the change detection circuit 312 detects a subsequent change in the frequency selection value 324. The change detection circuit 312 detects a change in the frequency selection value 324 by comparing a current value of the frequency selection value 324 to a previous value of the frequency selection value 324. The change detection circuit 312 includes a frequency selection input 312A and a trigger output 312B. The frequency selection input 312A is coupled to the frequency selection input 310A of the frequency control selector 310, and the change trigger output 312B is coupled to the phase seeding circuit 304.

Figure 4:
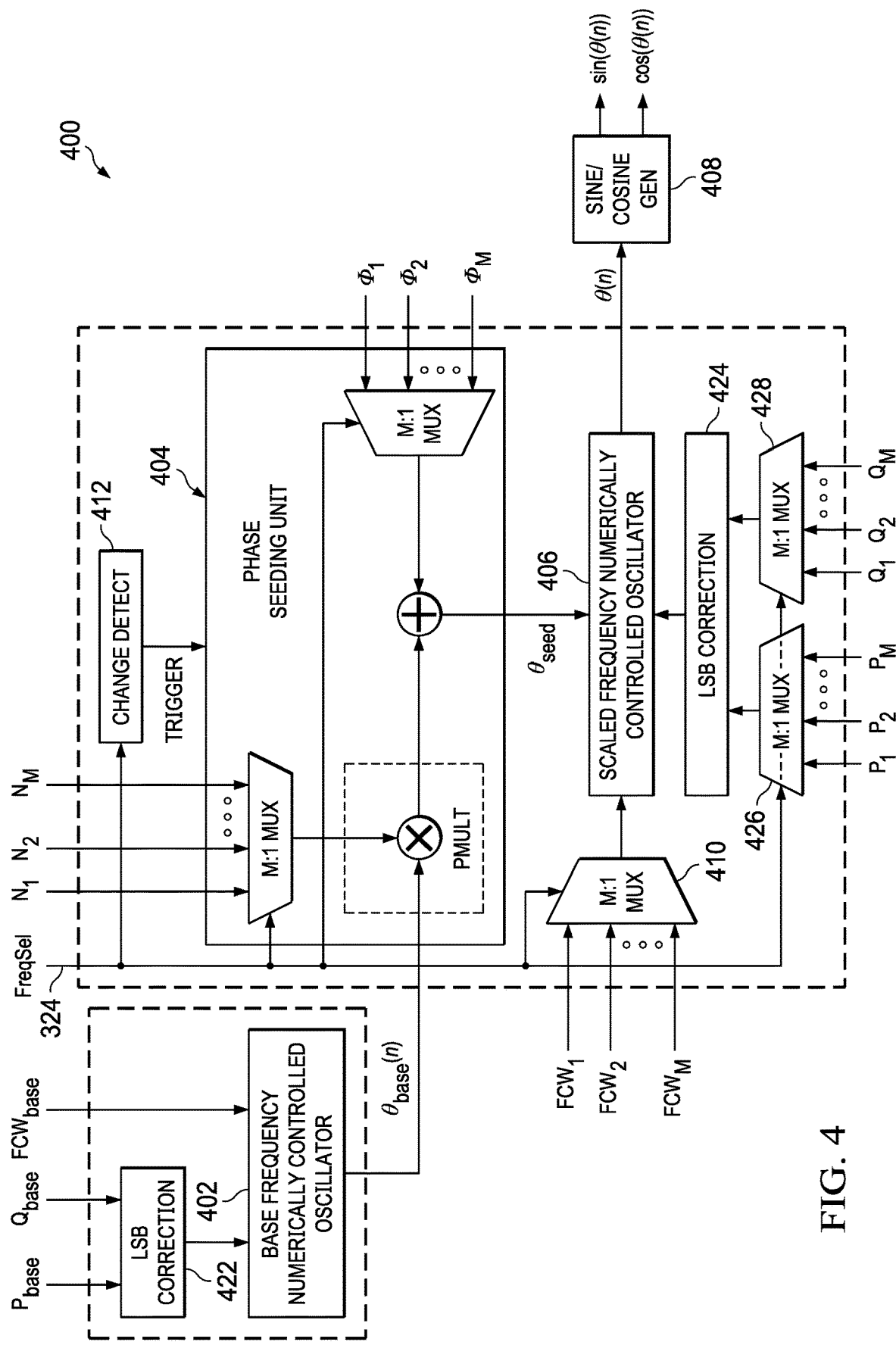
FIG. 4 shows a block diagram for an example phase coherent NCO that includes dynamic adjustment of accumulated phase to compensate for frequency error cause by limited phase accumulator and control word width in accordance with the present disclosure.

FIG. 4 shows a block diagram for an example phase coherent NCO circuit 400 that includes dynamic adjustment of accumulated phase to compensate for frequency error caused by limited phase accumulator and control word width in accordance with the present disclosure. The example phase coherent NCO circuit 400 is similar to the phase coherent NCO circuit 300 but includes phase adjustment circuitry that facilitates generation of frequencies that are not representable using just an integer frequency control word, at the operating sampling rate of interest. The phase coherent NCO circuit 400 includes a base frequency NCO 402, a phase seeding circuit 404, a scaled frequency NCO 406, a sine/cosine generator 408, a frequency control selector 410, a change detection circuit 412, LSB correction circuit 422, LSB correction circuit 424, selector 426, and selector 428.

In some implementations of the phase coherent NCO circuit 400, the phase seeding circuit 404, the sine/cosine generator 408, the frequency control selector 410, and the change detection circuit 412 are respectively similar to the phase seeding circuit 304, the sine/cosine generator 308, the frequency control selector 310, and the change detection circuit 312 as described with respect to the phase coherent NCO circuit 300. The base frequency NCO 402 is similar to the base frequency NCO 302, but allows for dynamic adjustment of the least significant bits of a phase value.

Figure 7:
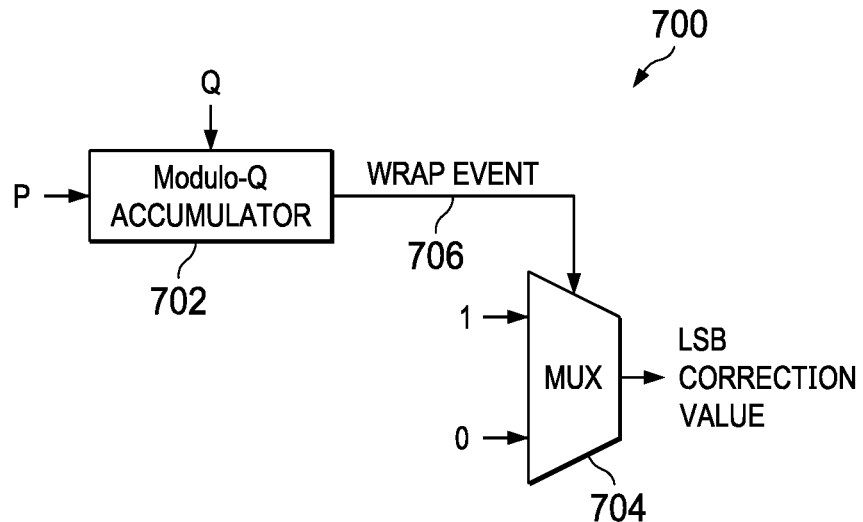
FIGS. 7 and 8 show example phase correction circuits suitable for use in implementations of the phase coherent NCO of FIGS. 4 and 6.
Figure 8:
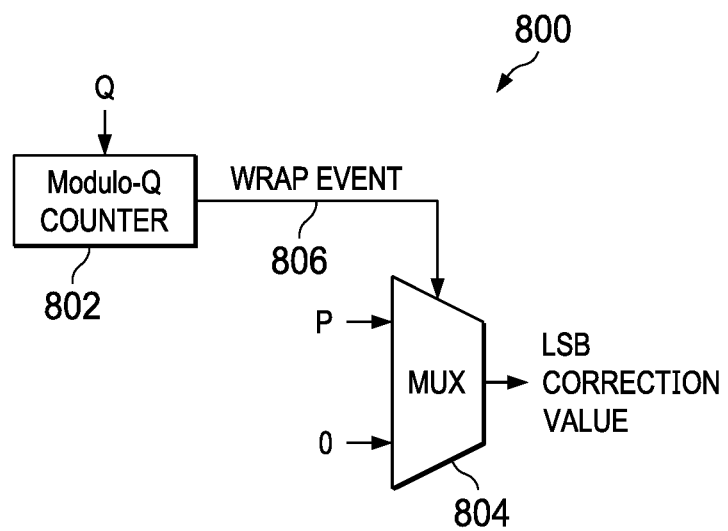

The LSB correction circuit 424 and the LSB correction circuit 422 are similar in some implementations of the phase coherent NCO 400, and examples of the LSB correction circuits 422 and 424 are provided by reference to FIGS. 7-9 and associated text. The values of P and Q are provided to the LSB correction circuit 424 by the selector 426 and the selector 428 respectively. The values of P and Q are selected by the selector 426 and the selector 428 based on the frequency selection value 324.

Figure 5:
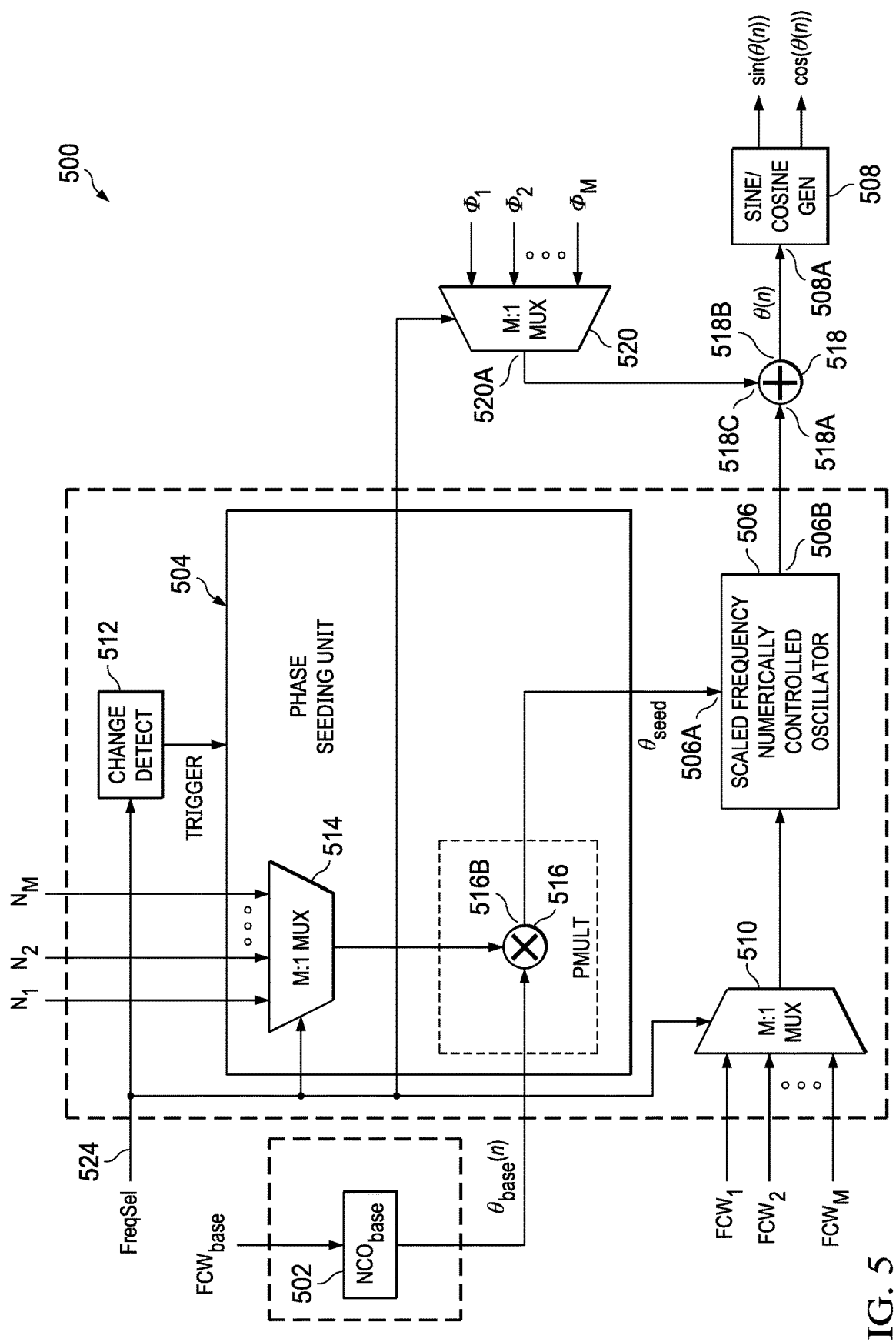
FIG. 5 shows a block diagram for another example phase coherent NCO in accordance with the present disclosure.

FIG. 5 shows a block diagram for another example phase coherent NCO 500 in accordance with the present disclosure. The example phase coherent NCO circuit 500 is similar to the phase coherent NCO circuit 300, but the phase multiplexer is coupled to the output of the scaled frequency NCO rather than the input of the scaled frequency NCO. The phase coherent NCO circuit 500 includes a base frequency NCO 502, a phase seeding circuit 504, a scaled frequency NCO 506, a sine/cosine generator 508, a frequency control selector 510, a change detection circuit 512, a phase multiplier 516, a phase summation circuit 518, and a phase multiplexer 520.

In some implementations of the phase coherent NCO circuit 500, the base frequency NCO 502, the scaled frequency NCO 506, the sine/cosine generator 508, the frequency control selector 510, the change detection circuit 512, the phase multiplier 516, the phase summation circuit 518, and the phase multiplexer 520 are respectively similar to the base frequency NCO 302, the scaled frequency NCO 306, the sine/cosine generator 308, the frequency control selector 310, the change detection circuit 312, the phase multiplier 316, the phase summation circuit 318, and the phase multiplexer 320 as described with respect to the phase coherent NCO circuit 300.

In the phase coherent NCO circuit 500, the scaled phase output 516B of the phase multiplier 516 is coupled to the seed phase input 506A of the scaled frequency NCO 506. The phase summation circuit 518 adds the phase offset values, provided by the phase multiplexer 520, to the phase output of the scaled frequency NCO 506 to generate the phase values θ(n) provided to the sine/cosine generator 508. The oscillator phase output 506B of the scaled frequency NCO 506 is coupled to the scaled phase input 518A of the phase summation circuit 518. The adjusted oscillator phase output 518B of the phase summation circuit 518 is coupled to the phase input 508A of the sine/cosine generator 508. The phase offset input 518C of the phase summation circuit 518 is coupled to the phase offset output 520A of the phase multiplexer 520.

Figure 6:
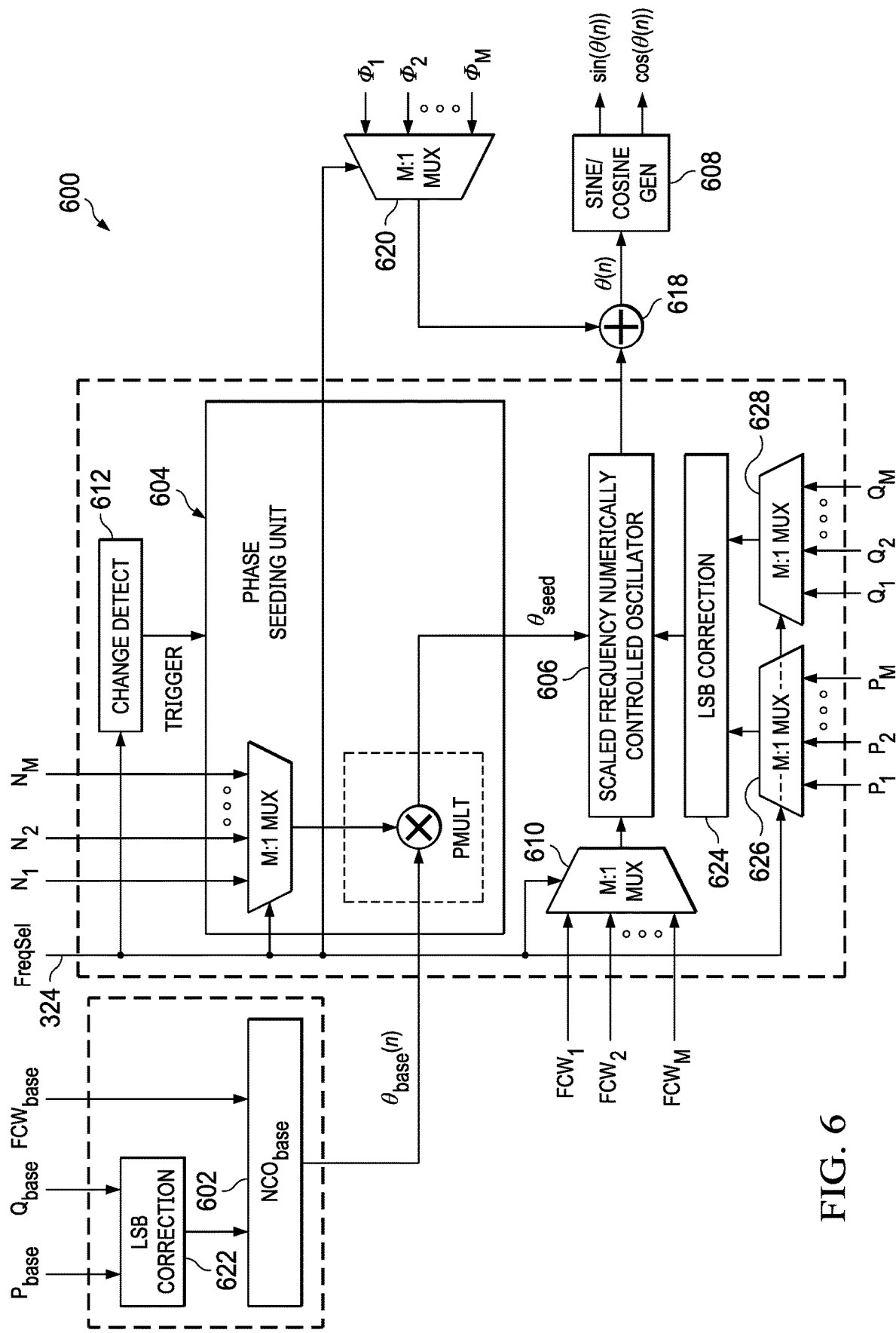
FIG. 6 shows a block diagram for another example phase coherent NCO that includes dynamic adjustment of accumulated phase to compensate for frequency error cause by limited phase accumulator and control word width in accordance with the present disclosure.

FIG. 6 shows a block diagram for another example phase coherent NCO 600 that includes dynamic adjustment of accumulated phase to compensate for frequency error cause by limited phase accumulator and control word width in accordance with the present disclosure. The phase coherent NCO circuit 600 is similar to the phase coherent NCO circuit 500 but includes phase adjustment circuitry that facilitates generation of frequencies that are not representable using just an integer frequency control word, at the operating sampling rate of interest. The phase coherent NCO circuit 600 includes a base frequency NCO 602, a phase seeding circuit 604, a scaled frequency NCO 606, a sine/cosine generator 608, a frequency control selector 610, a change detection circuit 612, a phase summation circuit 618, a phase multiplexer 620, an LSB correction circuit 622, an LSB correction circuit 624, a selector 626, and a selector 628.

In some implementations of the phase coherent NCO circuit 600, the phase seeding circuit 604, the sine/cosine generator 608, the frequency control selector 610, the change detection circuit 612, the phase summation circuit 618, and the phase multiplexer 620 are respectively be similar to the phase seeding circuit 504, the sine/cosine generator 508, the frequency control selector 510, the change detection circuit 512, the phase summation circuit 518, and the phase multiplexer 520 as described with respect to the phase coherent NCO circuit 500. The base frequency NCO 602 is similar to the base frequency NCO 502, but allows for dynamic adjustment of the least significant bits of a phase value.

The LSB correction circuit 624 and the LSB correction circuit 622 are respectively similar to the LSB correction circuit 424 and the LSB correction circuit 422 of the phase coherent NCO 400. Examples of the LSB correction circuits 622 and 624 are provided by reference to FIGS. 7-9 and associated text. The values of P and Q are provided to the LSB correction circuit 624 by the selector 626 and the selector 628 respectively. The values of P and Q are selected by the selector 626 and the selector 628 based on the frequency selection value 324.

FIG. 7 shows an example phase correction circuit 700 that is suitable for use as the LSB correction circuit (422, 424, 622, or 624) of the phase coherent NCO (400 or 600). The phase correction circuit 700 includes a modulo-Q accumulator 702 and a selector 704. The modulo-Q accumulator 702 receives as input values P and Q. For example, when operating as the LSB correction circuit 624, the modulo-Q accumulator 702 receives value P from the selector 626 and receives value Q from the selector 628. P specifies phase error in the digital local oscillator output signal as a number of least significant bits of error accumulated in Q oscillator output sample generation cycles. The modulo-Q accumulator 702 generates a control signal 706 that is activated for P out of every Q oscillator cycles to correct the phase error. The selector 704 provides for adjustment of oscillator phase by one bit (e.g., advancing the phase by one bit) with each activation of the control signal 706.

FIG. 8 shows an example phase correction circuit 800 that is suitable for use in the LSB correction circuit (422, 424, 622, or 624) of the phase coherent NCO (400 or 600). The phase correction circuit 800 includes modulo-Q accumulator 802 and a selector 804. The modulo-Q accumulator 802 receives as input values P and Q. For example, when operating as the LSB correction circuit 624, the modulo-Q accumulator 802 receives value P from the selector 626 and receives value Q from the selector 628. P specifies phase error in the digital local oscillator output signal as a number of least significant bits of error accumulated in Q oscillator output sample generation cycles. The modulo-Q accumulator 802 generates a control signal 806 that is activated for one out of every Q oscillator cycles to correct the phase error. The selector 804 provides for adjustment of oscillator phase by P bits with each activation of the control signal 806.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A phase coherent numerically controlled oscillator (NCO) circuit, comprising:
   a base frequency NCO comprising:
      a base frequency control input; and
      a base phase output;
   a phase seeding circuit coupled to the base frequency NCO and comprising:
      a base phase input coupled to the base phase output; and
      a seed phase output;
   a scaled frequency NCO coupled to the phase seeding circuit and comprising:
      a seed phase input coupled to the seed phase output; and
      an oscillator phase output;
   a sine/cosine generator comprising:
      a phase input coupled to the oscillator phase output; and
      a sine sample output;
   a phase summation circuit comprising:
      a scaled phase input coupled to the oscillator phase output; and
      an adjusted oscillator phase output coupled to the phase input of the sine/cosine generator; and
   a phase multiplexer comprising a phase offset output coupled to a phase offset input of the phase summation circuit.

2. A phase coherent numerically controlled oscillator (NCO) circuit, comprising:
   a base frequency NCO comprising:
      a base frequency control input; and
      a base phase output;
   a phase seeding circuit coupled to the base frequency NCO and comprising:
      a base phase input coupled to the base phase output; and
      a seed phase output;
   a scaled frequency NCO coupled to the phase seeding circuit and comprising:
      a seed phase input coupled to the seed phase output; and
      an oscillator phase output;
   a frequency control selector comprising:
      a frequency selection input; and
      a frequency control output coupled to a frequency control input of the scaled frequency NCO; and
   a change detection circuit comprising:
      a frequency selection input coupled to the frequency selection input of the frequency control selector; and
      a trigger output coupled to the phase seeding circuit.

3. A phase coherent numerically controlled oscillator (NCO) circuit, comprising:
   a base frequency NCO comprising:
      a base frequency control input; and
      a base phase output;
   a phase seeding circuit coupled to the base frequency NCO, and comprising:
      a base phase input coupled to the base phase output; and
      a seed phase output;
   a scaled frequency NCO coupled to the phase seeding circuit, and comprising:
      a seed phase input coupled to the seed phase output; and an oscillator phase output;
   wherein the phase seeding circuit further comprises a phase multiplier comprising:
      a base phase input coupled to the base phase output; and
      a scaled phase output;
   wherein the phase seeding circuit further comprises a frequency scaler selection circuit comprising a scale value output coupled to a scale value input of the phase multiplier.

4. A phase coherent numerically controlled oscillator (NCO) circuit, comprising:
   a base frequency NCO comprising:
      a base frequency control input; and
      a base phase output;

a phase seeding circuit coupled to the base frequency NCO, and comprising:
    a base phase input coupled to the base phase output; and
    a seed phase output;
a scaled frequency NCO coupled to the phase seeding circuit, and comprising:
    a seed phase input coupled to the seed phase output; and an oscillator phase output;
wherein the phase seeding circuit further comprises a phase multiplier comprising:
    a base phase input coupled to the base phase output; and a scaled phase output;
further comprising:
a phase summation circuit comprising:
    a scaled phase input coupled to the scaled phase output; and
    a seed phase output coupled to the seed phase input; and
a phase multiplexer comprising a phase offset output coupled to a phase offset input of the phase summation circuit.

5. A radio frequency (RF) sampling transceiver, comprising:
a digital mixer circuit; and
a phase coherent numerically controlled oscillator (NCO) circuit coupled to the digital mixer circuit, and comprising:
    a base frequency NCO comprising:
        a base frequency control input; and
        a base phase output;
    a phase seeding circuit coupled to the base frequency NCO and comprising:
        a base phase input coupled to the base phase output; and
        a seed phase output;
    a scaled frequency NCO coupled to the phase seeding circuit and comprising:
        a seed phase input coupled to the seed phase output; and
        an oscillator phase output;
    a sine/cosine generator comprising:
        a phase input coupled to the oscillator phase output; and
        a sine sample output;
    a phase summation circuit comprising:
        a scaled phase input coupled to the oscillator phase output; and
        an adjusted oscillator phase output coupled to the phase input of the sine/cosine generator; and
    a phase multiplexer comprising a phase offset output coupled to a phase offset input of the phase summation circuit.

6. A radio frequency (RF) sampling transceiver, comprising:
a digital mixer circuit; and
a phase coherent numerically controlled oscillator (NCO) circuit coupled to the digital mixer circuit, and comprising:
    a base frequency NCO comprising:
        a base frequency control input; and
        a base phase output;
    a phase seeding circuit coupled to the base frequency NCO, and comprising:
        a base phase input coupled to the base phase output; and
        a seed phase output;
    a scaled frequency NCO coupled to the phase seeding circuit, and comprising:
        a seed phase input coupled to the seed phase output; and an oscillator phase output;
wherein the phase coherent NCO circuit further comprises:
    a frequency control selector comprising:
        a frequency selection input; and
        a frequency control output coupled to a frequency control input of the scaled frequency NCO; and
    a change detection circuit comprising:
        a frequency selection input coupled to the frequency selection input of the frequency control selector; and
        a trigger output coupled to the phase seeding circuit.

7. A radio frequency (RF) sampling transceiver, comprising:
a digital mixer circuit; and
a phase coherent numerically controlled oscillator (NCO) circuit coupled to the digital mixer circuit, and comprising:
    a base frequency NCO comprising:
        a base frequency control input; and
        a base phase output;
    a phase seeding circuit coupled to the base frequency NCO, and comprising:
        a base phase input coupled to the base phase output; and
        a seed phase output;
    a scaled frequency NCO coupled to the phase seeding circuit, and comprising:
        a seed phase input coupled to the seed phase output; and an oscillator phase output;
wherein the phase seeding circuit further comprises a phase multiplier comprising:
    a base phase input coupled to the base phase output; and a scaled phase output;
wherein the phase seeding circuit further comprises a frequency scaler selection circuit comprising a scale value output coupled to a scale value input of the phase multiplier.

8. The RF sampling transceiver of claim 7, further comprising:
a phase summation circuit comprising:
    a scaled phase input coupled to the scaled phase output; and
    a seed phase output coupled to the seed phase input; and
a phase multiplexer comprising a phase offset output coupled to a phase offset input of the phase summation circuit.

9. A phase coherent numerically controlled oscillator (NCO) circuit, comprising:
a base frequency NCO configured to generate base phase values based on a base frequency control word;
a phase seeding circuit coupled to the base frequency NCO and configured to generate a seed phase value based on the base phase values and a scale factor value;
a scaled frequency NCO coupled to the phase seeding circuit and configured to generate oscillator phase values based on the phase seed value and an oscillator frequency control word; and
a sine/cosine generator coupled to the scaled frequency NCO, and configured to generate oscillator output samples based on the oscillator phase values;
a frequency control selector configured to route one of a plurality of frequency control words to the scaled frequency NCO based on a frequency selection value provided to the phase coherent NCO circuit; and change detection circuit coupled to the phase seeding circuit and the frequency control selector, and configured to:

detect a request to change the output frequency of the phase coherent NCO circuit, and responsive to detection of the request, trigger the phase seeding circuit to generate the seed phase value.

10. The phase coherent NCO circuit of claim 9, wherein the phase seeding circuit comprises a phase multiplier configured to generate a phase product by multiplying the base phase values and the scale factor value.

11. The phase coherent NCO circuit of claim 10, wherein the phase seeding circuit further comprises a frequency scaler selection circuit coupled to the phase multiplier, and configured to set the scale factor value to one of a plurality of scale factor values corresponding to the output frequency.

12. The phase coherent NCO circuit of claim 10, further comprising:

a phase multiplexer circuit configured to select one of a plurality of phase offset values corresponding to the output frequency; and a phase summation circuit coupled to the phase multiplier, and configured to add the one of the phase offset values and the phase product to generate the seed phase value.

13. A phase coherent numerically controlled oscillator (NCO) circuit, comprising:

a base frequency NCO configured to generate base phase values based on a base frequency control word;

a phase seeding circuit coupled to the base frequency NCO and configured to generate a seed phase value based on the base phase values and a scale factor value;

a scaled frequency NCO coupled to the phase seeding circuit and configured to generate oscillator phase values based on the phase seed value and an oscillator frequency control word; and a sine/cosine generator coupled to the scaled frequency NCO, and configured to generate oscillator output samples based on the oscillator phase values;

a phase multiplexer circuit configured to select one of a plurality of phase offset values corresponding to the output frequency; and a phase summation circuit coupled to the scaled frequency NCO, and configured to add the one of the phase offset values and the oscillator phase values.

* * * * *